US008916671B2

United States Patent
Ko et al.

(10) Patent No.: US 8,916,671 B2
(45) Date of Patent: Dec. 23, 2014

(54) SILICONE RESIN

(75) Inventors: Min Jin Ko, Daejeon (KR); Myung Sun Moon, Daejeon (KR); Jae Ho Jung, Daejeon (KR); Bum Gyu Choi, Daejeon (KR); Dae Ho Kang, Daejeon (KR); Min Kyoun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/555,574

(22) Filed: Jul. 23, 2012

(65) Prior Publication Data
US 2013/0187176 A1 Jul. 25, 2013

Related U.S. Application Data

(63) Continuation of application No. PCT/KR2011/000521, filed on Jan. 25, 2011.

(30) Foreign Application Priority Data

Jan. 25, 2010 (KR) .................. 10-2010-0006701
Jan. 25, 2011 (KR) .................. 10-2011-0007456

(51) Int. Cl.
| H01L 23/29 | (2006.01) |
| C08G 77/04 | (2006.01) |
| C08G 77/20 | (2006.01) |
| H01L 33/56 | (2010.01) |
| C08L 83/04 | (2006.01) |
| C08G 77/12 | (2006.01) |
| C08K 5/56 | (2006.01) |
| C08G 77/00 | (2006.01) |

(52) U.S. Cl.
CPC ............ *C08G 77/20* (2013.01); *H01L 23/29* (2013.01); *C08G 77/12* (2013.01); *H01L 23/296* (2013.01); *C08K 5/56* (2013.01); *H01L 33/56* (2013.01); *C08L 83/04* (2013.01); *C08G 77/70* (2013.01)
USPC .............. 528/43; 257/787; 257/791; 528/27; 528/32

(58) Field of Classification Search
None
See application file for complete search history.

(56) References Cited

U.S. PATENT DOCUMENTS

2006/0081864 A1\* 4/2006 Nakazawa ............ 257/98
2009/0105395 A1\* 4/2009 Kamata et al. ........ 524/502

FOREIGN PATENT DOCUMENTS

| CN | 1798810 A | 7/2006 |
| JP | 2000169714 A | 6/2000 |
| JP | 2009185226 A | 8/2009 |
| KR | 1020060016107 A | 2/2006 |
| KR | 1020080008286 A | 1/2008 |
| KR | 1020090077955 A | 7/2009 |
| WO | 2004/107458 A2 | 12/2004 |
| WO | WO 2007/100445 A2 \* | 9/2007 |
| WO | WO 2007/125785 \* | 11/2007 |

OTHER PUBLICATIONS

International Search Report issued in International Appn. No. PCT/KR2011/000521, mailed Oct. 21, 2011, 2 pages.
Office Action cited in Chinese Patent Application No. 201180006438.5, issued on Sep. 26, 2013, along with English translation, 11 pages.

\* cited by examiner

*Primary Examiner* — Marc Zimmer
(74) *Attorney, Agent, or Firm* — Rothwell, Figg, Ernst & Manbeck, P.C.

(57) ABSTRACT

A silicone resin is provided. The silicone resin may be effectively used to encapsulate a semiconductor element, for example, a light-emitting element of a light-emitting diode.

13 Claims, No Drawings

SILICONE RESIN

CROSS REFERENCE TO RELATED APPLICATION

The present application is a continuation application of International Application PCT/KR2011/000521, with an international filing date of Jan. 25, 2011, which claims priority to and the benefit of Korean Patent Application No. 10-2010-0006701, filed Jan. 25, 2010, and of Korean Patent Application No. 10-2011-0007456, filed Jan. 25, 2011, the disclosures of which are incorporated herein by reference in their entireties.

TECHNICAL FIELD

The present invention relates to a silicone resin.

BACKGROUND ART

As a LED (light emitting diode), particularly as a blue or an UV LED that has an emission wavelength of approximately 250 nm to 550 nm, a high-brightness LED product using a compound semiconductor of a GaN compound such as GaN, GaAlN, InGaN or InAlGaN has been obtained. Also, a high-definition full color image may be formed using a technique to combine red and green LEDs with a blue LED. For example, a technique to prepare a white LED by combining a blue LED or an UV LED with a phosphor has been known. Such LEDs have been increasingly required for general lighting or backlight in liquid crystal displays (LCDs).

As an encapsulant for the LEDs, an epoxy resin that has high adhesive strength and excellent dynamic durability has been widely used. However, the epoxy resin has problems in that it has low transmittance with respect to light having blue to UV wavelength regions, and also shows deteriorated lightfastness. Therefore, techniques of solving the above-described problems have been proposed, for example, in Japanese Patent Laid-Open Publication Nos. Hei11-274571, 2001-196151 and 2002-226551. However, encapsulants described in this literature show insufficient lightfastness.

As a material having excellent lightfastness with respect to a low wavelength range, a silicone resin has been known. However, the silicone resin has disadvantages in that its heat resistance is poor, and its surface is sticky after curing. Also, in order to effectively apply the silicone resin as an LED encapsulant, characteristics such as a high refractive property, crack resistance, surface hardness, adhesive strength and thermal shock resistance must be secured.

DISCLOSURE

Technical Problem

An object of the present invention includes providing a silicone resin.

Technical Solution

The present invention relates to a silicone resin that is represented by an average composition formula of Formula 1 and also that has a siloxane unit of Formula 2 and a siloxane unit of Formula 3:

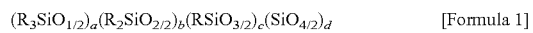

[Formula 1]

[Formula 2]

[Formula 3]

wherein, Rs are substituents directly bound to a silicon atom, and each independently represents hydrogen, an alkoxy group, a hydroxy group, an epoxy group, a (meth)acryloyl group, an isocyanate group or a monovalent hydrocarbon group, $R^1$ and $R^2$ each independently represent an alkyl group and an aryl group, $R^3$ represents an aryl group, a is in a range of $0 \le a \le 0.5$, b is in a range of $0 < b \le 0.8$, c is in a range of $0 < c \le 0.8$, and d is in a range of $0 \le d \le 0.2$, with the proviso that a+b+c+d is 1 and at least one of $R^1$ and $R^2$ represents an aryl group.

Hereinafter, the silicone resin will be described in detail.

The silicone resin is represented by an average composition formula of Formula 1. In this specification, the silicone resin being represented by a certain average composition formula includes the case where the resin comprises a single resin that is represented by the certain average composition formula as well as the case where the resin includes a mixture of at least two resins, and an average composition of the at least two resins is represented by the certain average composition formula.

The silicone resin includes both a bifunctional unit represented by Formula 2 and a trifunctional unit represented by Formula 3 as siloxane units included in the resin. Therefore, the silicone resin shows excellent optical characteristics such as a refractive index, and may for example show excellent light extraction efficiency in its application to LEDs. Also, the silicone resin shows low viscosity at the time of its application, has excellent processability and workability, and shows excellent crack resistance, hardness, thermal shock resistance and adhesive strength after its application. Also, the silicone resin has excellent long-term reliability under high-temperature and/or high-moisture conditions, and also prevents turbidity and stickiness on the surface under high-temperature and/or high-moisture conditions.

In Formula 1, the R groups are substituents that are directly bound to the silicon atom. Also, the R groups may be the same or different from each other, and each independently represent hydrogen, a hydroxy group, an epoxy group, an acryloyl group, a methacryloyl group, an isocyanate group, an alkoxy group or a monovalent hydrocarbon group. In this case, Rs may be substituted with one or more substituents, when necessary.

In Formula 1, the alkoxy group may be a linear, branched or cyclic alkoxy group having 1 to 12 carbon atoms, preferably 1 to 8 carbon atoms, and more preferably 1 to 4 carbon atoms, and, more particularly, may include a methoxy group, an ethoxy group, a propoxy group, an isopropoxy group, a butoxy group, an isobutoxy group or a tert-butoxy group.

Also in Formula 1, the monovalent hydrocarbon group may, for example, be an alkyl group, an alkenyl group, an aryl group or an arylalkyl group, preferably an alkyl group, an alkenyl group or an aryl group.

In Formula 1, the alkyl group may be a linear, branched or cyclic alkyl group having 1 to 12 carbon atoms, preferably 1 to 8 carbon atoms, and more preferably 1 to 4 carbon atoms, preferably a methyl group.

Also in Formula 1, the alkenyl group may be an alkenyl group having 2 to 12 carbon atoms, preferably 2 to 8 carbon atoms, and more preferably 2 to 4 carbon atoms, preferably a vinyl group.

Also in Formula 1, the aryl group may be an aryl group having 6 to 18 carbon atoms, and preferably 6 to 12 carbon atoms, preferably a phenyl group.

Furthermore, in Formula 1, the arylalkyl group may be an arylalkyl group having 6 to 19 carbon atoms, and preferably 6 to 13 carbon atoms, and be, for example, a benzyl group.

In Formula 1, at least one of the R groups is an aryl group, preferably a phenyl group. Also, the aryl group may, for example, be included in the siloxane unit of Formula 2 or 3.

Also, at least one of the R groups in Formula 1 may preferably be a hydroxy group, an epoxy group, an acryloyl group, a methacryloyl group or a vinyl group, and more preferably an epoxy group. Such a functional group may further improve adhesive strength of an encapsulant.

In Formula 1, a, b, c and d represent mole fractions of the siloxane units, respectively, and the total sum of a, b, c and d is 1. Also in Formula 1, a may be in a range of 0 to 0.5, preferably in a range of 0 to 0.4, b may be greater than 0 and 0.8 or less, preferably greater than 0 and 0.7 or less, c may be greater than 0 and 0.8 or less, preferably greater than 0 and 0.7 or less, and d is in a range of 0 to 0.2, preferably in a range of 0 to 0.15.

The silicone resin includes at least one aryl group, preferably a phenyl group, which is bound to the silicon atom. Preferably, in the silicone resin, a molar ratio (Ar/Si) of the aryl group (Ar) bound to the silicon atom with respect to the total silicon atoms (Si) in the resin may be in a range of 0.7 to 1.3, preferably in a range of 0.7 to 1.2. When the molar ratio (Ar/Si) is within this range, it is possible to maintain excellent refractive index, light extraction efficiency, crack resistance, hardness and viscosity of the silicone resin or an encapsulant including the silicone resin.

According to the present invention, the silicon atoms to which the aryl groups are bound are preferably distributed and included in the siloxane unit of Formula 2 and the siloxane unit of Formula 3. More preferably, all the silicon atoms to which the aryl groups in the resin are bound are included in the siloxane unit of Formula 2 or 3.

In the above, the siloxane unit of Formula 2 is a difunctional siloxane unit, and $R^1$ and $R^2$ in Formula 2 each independently represent an alkyl group or an aryl group, in which at least one of $R^1$ and $R^2$ is an aryl group. In this case, specific kinds of the alkyl group and aryl group are the same as described in connection with the R groups in Formula 1 above, and the alkyl group in Formula 2 is preferably a methyl group, and the aryl group is preferably a phenyl group.

According to the present invention, the siloxane unit of Formula 2 may preferably be a siloxane unit of the Formula 4 and/or 5:

$(C_6H_5)(CH_3)SiO_{2/2}$      [Formula 4]

$(C_6H_5)_2SiO_{2/2}$.      [Formula 5]

In the silicone resin, a molar ratio (Ar/Si) of the aryl group (Ar) in the siloxane unit of Formula 2 with respect to the total silicon atoms (Si) in the resin may be in a range of 0.3 to 0.8, preferably in a range of 0.4 to 0.7. When the molar ratio (Ar/Si) is adjusted to 0.3 or more, it is possible to maintain excellent viscosity, refractive index and moisture resistance of the silicone resin, whereas when the molar ratio (Ar/Si) is adjusted to 0.8 or less, it is possible to maintain excellent hardness of the silicone resin.

In the silicone resin, a ratio of the siloxane unit of Formula 2 with respect to the total bifunctional siloxane units in the resin may also be 35 mol % or more, preferably 40 mol % or more. When such a content (mol %) is within this range, it is possible to maintain excellent light extraction efficiency, crack resistance, hardness and viscosity of the silicone resin or an encapsulant including the silicone resin. As such, an upper limit of the term "mol %" is not particularly limited, but is, for example, 100 mol %.

Formula 3 represents a trifunctional siloxane unit that includes aryl groups directly bound to the silicon atom. Specific examples of the aryl group are the same as described in connection with the R groups in Formula 1 above, and the aryl group may be preferably a phenyl group.

The siloxane unit of Formula 3 may be represented by Formula 6.

$(C_6H_5)SiO_{3/2}$      [Formula 6]

In the silicone resin, a molar ratio (Ar/Si) of aryl group (Ar) in the siloxane unit of Formula 3 with respect to the total silicon atoms (Si) in the resin may be in a range of 0.25 to 0.7, preferably in a range of 0.25 to 0.7. When the molar ratio (Ar/Si) is adjusted to the above-mentioned range, it is possible to maintain excellent hardness, refractive index and viscosity of the silicone resin or the encapsulant.

In the silicone resin, a ratio of the siloxane unit of Formula 3 with respect to the total trifunctional siloxane units in the resin may also be 70 mol % or more, preferably 80 mol % or more. When such a content (mol %) is within this range, it is possible to maintain excellent light extraction efficiency, crack resistance, hardness and viscosity of the silicone resin or an encapsulant including the silicone resin. As such, an upper limit of the term "mol %" is not particularly limited, but is, for example, 100 mol %.

The silicone resin may, for example, have a viscosity at 25° C. of 500 cP to 100,000 cP, preferably 500 cP to 50,000 cP. When the viscosity of the silicone resin is within this range, it is possible to maintain excellent processability and hardness of the silicone resin.

According to the present invention, the silicone resin may have a molecular weight of 300 to 100,000, preferably 300 to 50,000, and more preferably 500 to 30,000. When the molecular weight of the resin is adjusted to the above-mentioned range, the encapsulant has excellent hardness, and may also show excellent processability. In the present invention, unless stated otherwise, the term "molecular weight" refers to a weight average molecular weight ($M_w$). Also, a weight average molecular weight refers to a value that is a converted value with respect to standard polystyrene and that is measured by gel permeation chromatography (GPC).

The above-mentioned silicone resin may be prepared in various methods known in the art. For example, the silicone resin may be prepared, for example, using an addition-curable silicone material, a condensation-curable or polycondensation-curable silicone material, a UV-curable silicone material or a peroxide-vulcanized silicone material, and preferably be prepared using an addition-curable silicone material, a condensation-curable or polycondensation-curable silicone material or a UV-curable silicone material.

The addition-curable silicone material is cured by hydrosilylation. This material includes at least an organic silicon compound having hydrogen atoms directly bound to silicon atom and an organic silicon compound having an unsaturated aliphatic group such as a vinyl group and the organic silicon compounds react to each other to be cured in the presence of a catalyst. Examples of the catalyst may include metals in Group VIII of the Periodic Table, catalysts for supporting the metals to a carrier such as alumina, silica or carbon black, salts or complexes of the metals. The metals in Group VIII of the Periodic Table which may be used herein include platinum, rhodium or ruthenium, although platinum is preferred.

A method using the condensation-curable or polycondensation-curable silicone material includes a method of preparing a silicone resin by means of hydrolysis and condensation of a silicon compound or a hydrolysate thereof, such as silane or siloxane, which has a hydrolyzable functional group such as a halogen atom or an alkoxy group. A unit compound which may be used in this method may include a silane compound such as $R^a{}_3Si(OR^b)$, $R^a{}_2Si(OR^b)_2$, $R^aSi(OR^b)_3$ and $Si(OR^b)_4$. In the silane compound, $(OR^b)$ may represent a linear or branched alkoxy group having 1 to 8 carbon atoms, and, more particularly, may be methoxy, ethoxy, n-propoxy, n-butoxy, isopropoxy, isobutoxy, sec-butoxy or t-butoxy. Also in the silane compound, $R^a$ is a functional group bound to a silicon atom, and may be selected in consideration of substituents in a desired silicone resin.

A method using the UV-curable silicone material includes a method, in which a silicon compound, such as silane or siloxane having a UV-reactive group such as an acryloyl group or a hydrolysate thereof is subjected to hydrolysis and condensation so as to prepare a resin, and then preparing a desired resin by UV irradiation.

The above addition-curable, condensation-curable or polycondensation-curable, or UV-curable silicone materials are widely known in the art, and a desired resin may be readily prepared using the above-mentioned known materials by a person skilled in the art, depending on a desired silicone resin.

The present invention also relates to a semiconductor device that includes a semiconductor element which is encapsulated by an encapsulant including the above silicone resin.

Exemplary kinds of the semiconductor element which may be encapsulated by the encapsulant may include semiconductor devices used in a diode, a transistor, a thyristor, a solid-phase image pickup device, an integral IC and a hybrid IC. Additionally, exemplary examples of the semiconductor device may include a diode, a transistor, a thyristor, a photocoupler, CCD, an integral IC, a hybrid IC, LSI, VLSI and a light-emitting diode (LED).

In one embodiment, the semiconductor device may be a light-emitting diode that includes a light-emitting element which is encapsulated by an encapsulant including the silicone resin.

Kinds of the light-emitting element which may be used therein are not particularly limited. For example, a light-emitting element formed by stacking a semiconductor material on a substrate may be used. In this case, examples of the semiconductor material may include, but are not limited to, GaAs, GaP, GaAlAs, GaAsP, AlGaInP, GaN, InN, AlN, InGaAlN or SiC. Also, examples of the substrate used herein may include sapphire, spinel, SiC, Si, ZnO or a GaN single crystal.

According to the present invention, a buffer layer may also be formed between the substrate and the semiconductor material, when necessary. In this case, a GaN or AlN may be used as the buffer layer. A method of stacking a semiconductor material on a substrate is not particularly limited, but may include, for example, an MOCVD, HDVPE or a liquid phase epitaxy method. In the present invention, a structure of the light-emitting element may include, for example, a mono-junction structure, a heterojunction structure and a double heterojunction structure having an MIS junction, a PN junction, or a PIN junction. Also, the light-emitting device may be formed in a single or multiple quantum well structure.

In one embodiment of the present invention, an emission wavelength of the light-emitting device may be, for example, in a range of 250 nm to 550 nm, preferably in a range of 300 nm to 500 nm, and more preferably in a range of 330 nm to 470 nm. Here, the emission wavelength represents a peak emission wavelength. When the emission wavelength of the light-emitting device is set to this wavelength, it is possible to obtain a white LED having a longer life span and showing high energy efficiency and color reproduction.

The LED may be manufactured by encapsulating a light-emitting device, particularly a light-emitting device having an emission wavelength of 250 nm to 550 nm, with a thermosetting composition according to the present invention. In this case, the encapsulation of the light-emitting device may be performed using only the composition according to the present invention, and may be performed in combination with another encapsulant, when necessary. When two encapsulants are used together, a light-emitting device may be encapsulated with the composition of the present invention, followed by encapsulating the primarily encapsulated light-emitting device with another encapsulant, or may be encapsulated with another encapsulant, followed by encapsulating the primarily encapsulated light-emitting device with the composition of the present invention. The other encapsulant which may be used herein may include an epoxy resin, a silicone resin, an acryl resin, a urea resin, an imide resin or glass.

For example, a method of encapsulating a light-emitting device with the composition of the present invention includes a method of first injecting a thermosetting composition into a mold-type cast, soaking a lead frame, in which a light-emitting device is fixed, in the thermosetting composition and curing the thermosetting composition. In this case, examples of the method of injecting a thermosetting composition may include injection using a dispenser, transfer molding, injection molding, etc. Also, other encapsulation methods used herein may include a method of applying a thermosetting composition onto a light-emitting device and curing the thermosetting composition by means of a dropping, stencil printing, screen printing or mask process, a method of injecting a thermosetting composition into a cup having a light-emitting device disposed therein using a dispenser and curing the thermosetting composition, etc. Also, the thermosetting composition of the present invention may be used as a die-bond material for fixing a light-emitting device in a lead terminal or a package, a passivation film on a light-emitting device, a package substrate, etc.

The above-mentioned method of curing the composition of the present invention is not particularly limited, but may be performed, for example, by heating a composition at a temperature of 60° C. to 200° C. for 10 minutes to 5 hours, and be optionally performed by undergoing at least two steps of the curing process at conditions of suitable temperature and time.

A shape of an encapsulated portion is not particularly limited, but may be formed in a shell-type lens, planar or thin-film shape.

In the present invention, performance of the LED may also be improved using additional conventionally known methods. Methods of improving the performance may, for example, include a method of installing a light reflective layer or a light-concentrating layer at a rear surface of a light-emitting device, a method of forming a complementarily colored portion at a bottom of a light-emitting device, a method of installing a layer for absorbing light of a wavelength shorter than a main emission peak wavelength on a light-emitting device, a method of encapsulating a light-emitting device and further molding the light-emitting device using a hard material, a method of fixing an LED through a through hole, a method of connecting a light-emitting device to a lead member using a flip chip interconnection, thereby extracting light in a direction of a substrate, etc.

The LED of the present invention may be, for example, effectively used as a light source such as a backlight unit of a liquid crystal display device (LCD), lightings, various sensors, a printer, or a photocopier, a light source for an automobile dashboard, a traffic light, a pilot lamp, a display device, a light source for a planar luminous body, displays, decorations or various lights.

Advantageous Effects

The silicone resin may show an excellent refractive index, and thus may have excellent light extraction efficiency when it is, for example, applied as an encapsulant for LEDs. Also, the silicone resin shows excellent processability and workability at the time of its application, and excellent crack resistance, hardness, thermal shock resistance and adhesive strength after its application, and has an effect to prevent surface stickiness and turbidity under severe conditions.

BEST MODE

Hereinafter, exemplary embodiments of the present invention will be described in further detail.

Hereinafter, in these Examples, "Vi" means a "vinyl group," "Ph" means a "phenyl group," "Me" means a "methyl group," and "Ep" means an "epoxy group."

1. Evaluation of Device Properties

A 5630 LED package that was prepared by using a polyphthalamide (PPA) was used to evaluate device properties. Specifically, a curable resin composition was dispensed into a polyphthalamide cup, and cured at a constant temperature of 60° C. for 30 minutes, and then at a constant temperature of 150° C. for 1 hour so as to prepare a surface-mounted type LED. Then, the LED was evaluated for thermal shock and long-term reliability under the high-temperature/high-moisture conditions, as follows.

<Criteria for Evaluation of Thermal Shock>

One cycle, in which of the prepared surface-mounted type LED was left at a constant temperature of −40° C. for 30 minutes, and then was left at a constant temperature of 100° C. for 30 minutes, was repeated 10 times. Then, the surface-mounted type LED was cooled at room temperature, and evaluated for a peeling state to determine the thermal shock resistance (ten surface-mounted type LEDs were prepared in each of Examples and Comparative Examples and evaluated for a peeling state).

<Long-Term Reliability at High-Temperature/High-Moisture Conditions>

The prepared surface-mounted type LED was operated for 100 hours by applying a current of 60 mA under the state where the LED was left at a temperature of 85° C. and a relative humidity of 85%. After the completion of the operation, luminance of the LED was then measured to calculate reduction in luminance with respect to the initial luminance, and reliability was evaluated according to the following criteria.

<Evaluation Criteria>

○: Luminance was reduced by 10% or less with respect to initial luminance x: Luminance was reduced by 10% or more with respect to initial luminance

MODE FOR INVENTION

Example 1

100 g of a linear organosiloxane compound (Formula 1), 300 g of a branched siloxane compound (Formula 2), 10.0 g of a tackifier (Formula 3), and 100.0 g of a hydrogen siloxane compound (Formula 4) were mixed, all of which were prepared by a conventional method and represented by the Formulas below. Then, a catalyst (platinum(0)-1,3-divinyl-1,1,3,3-tetramethyldisiloxane) was blended in such an amount that the content of Pt(0) in the resulting mixture was 20 ppm, homogeneously mixed, and degassed to prepare a curable composition $[ViMe_2SiO_{1/2}]_2[Me_2SiO_{2/2}]_{10}[Ph_2SiO_{2/2}]_4[PhMeSiO_{2/2}]_4$ [Formula 1]

$[ViMeSiO_{2/2}][PhMeSiO_{2/2}][PhSiO_{3/2}]_{14}[ViMe_2SiO_{1/2}]_3$ [Formula 2]

$[ViMe_2SiO_{1/2}]_2[EpSiO_{3/2}]_2[PhMeSiO_{2/2}]_{10}$ [Formula 3]

$[HMe_2SiO_{1/2}]_2[Ph_2SiO_{2/2}]$ [Formula 4]

Example 2

A curable composition was prepared in the same manner as in Example 1, except that a platinum catalyst was mixed with a mixture prepared by mixing 100 g of a linear organosiloxane compound represented in Formula 5, 300 g of the branched siloxane compound of Formula 2, 10.0 g of the tackifier of Formula 3 and 105.0 g of the hydrogen siloxane compound of Formula 4.

$[ViMe_2SiO_{1/2}]_2[Me_2SiO_{2/2}]_9[Ph_2SiO_{2/2}]_5[PhMeSiO_{2/2}]_4$ [Formula 5]

Example 3

A curable composition was prepared in the same manner as Example 1, except that a platinum catalyst was mixed with a mixture prepared by mixing 100 g of a linear organosiloxane compound represented in Formula 6, 300 g of the branched siloxane compound of Formula 2, 10.0 g of the tackifier of Formula 3 and 101.0 g of the hydrogen siloxane compound of Formula 4.

$[ViMe_2SiO_{1/2}]_5[Me_2SiO_{2/2}]_3[Ph_2SiO_{2/2}]_5[PhMeSiO_{2/2}]_8$ [Formula 6]

Example 4

A curable composition was prepared in the same manner as Example 1, except that a platinum catalyst was mixed with a mixture prepared by mixing 100 g of a linear organosiloxane compound represented in Formula 7, 300 g of the branched siloxane compound of Formula 2, 10.0 g of the tackifier of Formula 3 and 100.0 g of the hydrogen siloxane compound of Formula 4.

$[ViMe_2SiO_{1/2}]_2[Me_2SiO_{2/2}]_3[Ph_2SiO_{2/2}]_7[PhMeSiO_{2/2}]_8$ [Formula 7]

Example 5

A curable composition was prepared in the same manner as Example 1, except that a platinum catalyst was mixed with a mixture prepared by mixing 100 g of a linear organosiloxane compound represented in Formula 8, 300 g of the branched siloxane compound of Formula 2, 10.0 g of the tackifier of Formula 3 and 99.0 g of the hydrogen siloxane compound of Formula 4.

$[ViMe_2SiO_{1/2}]_2[Me_2SiO_{2/2}][Ph_2SiO_{2/2}]_9[PhMeSiO_{2/2}]_8$ [Formula 8]

Example 6

A curable composition was prepared in the same manner as Example 1, except that a platinum catalyst was mixed with a mixture prepared by mixing 100 g of a linear organosiloxane compound represented in Formula 9, 300 g of the branched siloxane compound of Formula 2, 10.0 g of the tackifier of Formula 3 and 98.0 g of the hydrogen siloxane compound of Formula 4.

$$[ViMe_2SiO_{1/2}]_2[Ph_2SiO_{2/2}]_{10}[PhMeSiO_{2/2}]_8 \quad \text{[Formula 9]}$$

TABLE 1

|  | Thermal Shock Test | High-temperature/High-moisture Reliability |
|---|---|---|
| Example 1 | 1/10 | ○ |
| Example 2 | 0/10 | ○ |
| Example 3 | 1/10 | ○ |
| Example 4 | 0/10 | ○ |
| Example 5 | 0/10 | ○ |
| Example 6 | 1/10 | ○ |

As seen from Table 1, it was confirmed that the curable compositions of the Examples of the present invention had excellent thermal shock resistance after curing, and showed excellent properties in the high-temperature/high-moisture long-term reliability test.

TEST EXAMPLES

Measurement of Moisture Permeability, Reliability and Yellowing Prevention Effect In order to confirm effects of the silicone resin including both the siloxane units of Formulas 2 and 3 according to the present invention, test samples prepared in the following method were measured for physical properties using the following method.

(1) Measurement of Moisture Permeability

A composition of each test sample was cured at 150° C. for 1 hour so as to prepare a 1 mm-thick planar test sample, and the prepared planar test sample was measured for moisture permeability. Moisture permeability of the planar test sample was measured in a thickness direction in the same conditions using a Mocon tester, and the results are listed in the following Table 2.

(2) Measurement of Reliability Under High-Temperature and High-Humidity Conditions A composition of each test sample was coated on a glass substrate at the same thickness, cured, and then kept at a temperature of 85° C. and a relative humidity of 85% for 500 hours. Then, peel strength of the cured product of the composition to the glass substrate was evaluated in a peel test, and a value of the peel strength was evaluated according to the following criteria, thereby evaluating reliability of the composition under high-temperature and high-moisture conditions.

<Evaluation Criteria>

○: Peel strength to a glass substrate was similar to or greater than 15 gf/mm x: Peel strength to a glass substrate was less than 15 gf/mm (3) Measurement of Yellowing Each test sample used to measure the moisture permeability was illuminated with light at 60° C. for 3 days using a Q-UVA (340 nm, 0.89 W/Cm²) tester, and evaluated for yellowing according to the following criteria. The results are described as follows.

<Evaluation Criteria>

○: Absorbance of light of 450 nm wavelength was less than 5% x: Absorbance of light of 450 nm wavelength was 5% or more.

Test Sample A

As the organosiloxane compounds synthesized by known methods, compounds represented by Formulas A, B, C and D were mixed together so as to prepare a siloxane composition (Mixing ratios: Compound A: 100 g, Compound B: 10 g, Compound C: 200 g, and Compound D: 60 g) which may be cured by hydrosilylation. Then, a catalyst (platinum (0)-1,3-divinyl-1,1,3,3-tetramethyldisiloxane) was mixed in such an amount that the content of Pt(0) in the composition was 20 ppm and homogeneously mixed to prepare a curable composition (A).

$$(ViMe_2SiO_{1/2})_2(ViMeSiO_{2/2})_2(Ph_\square SiO_{2/2})_{20}$$
$$(Me_\square SiO_{2/2})_{20} \quad \text{[Formula A]}$$

$$(ViMe_2SiO_{1/2})_2(EpSiO_{3/2})_3(MePhSiO_{2/2})_{20} \quad \text{[Formula B]}$$

$$(ViMe_2SiO_{1/2})_3(MePhSiO_{2/2})_1(PhSiO_{3/2})_7 \quad \text{[Formula C]}$$

$$(HMe_2SiO_{1/2})_2(Ph_2SiO_{2/2})_{1.5} \quad \text{[Formula D]}$$

Test Sample B

As the organosiloxane compounds synthesized by known methods, compounds represented by the Formulas E to G were mixed together to prepare a siloxane composition (Blending ratios: Compound E: 100 g, Compound F: 20 g, and Compound G: 50 g) which may be cured by hydrosilylation. Then, a catalyst, (platinum (0)-1,3-divinyl-1,1,3,3-tetramethyldisiloxane), was blended in such an amount that the content of Pt(0) in the composition was 20 ppm and homogeneously mixed to prepare a curable composition (B).

$$(ViMe_2SiO_{1/2})_2(ViMeSiO_{2/2})_{15}(MeSiO_{3/2})_5$$
$$(Me_2SiO_{2/2})_{50} \quad \text{[Formula E]}$$

$$(ViMe_2SiO_{1/2})_3(MeSiO_{3/2})_4(PhSiO_{3/2})_{1.5} \quad \text{[Formula F]}$$

$$(HMe_2SiO_{1/2})_2(HMeSiO_{2/2})_2(Me_2SiO_{2/2})_{10} \quad \text{[Formula G]}$$

Test Sample C

As the organosiloxane compounds synthesized by known methods, compounds represented by Formulas H to J were mixed together to prepare a siloxane composition (Blending ratios: Compound H: 100 g, Compound I: 20 g, Compound J: 50 g) which may be cured by hydrosilylation. Then, a catalyst, (platinum (0)-1,3-divinyl-1,1,3,3-tetramethyldisiloxane), was blended in such an amount that the content of Pt(0) in the composition was 20 ppm and homogeneously mixed to prepare a curable composition (C).

$$(ViPh_2SiO_{1/2})_2(Me_2SiO_{2/2})_{20} \quad \text{[Formula H]}$$

$$(ViPh_2SiO_{1/2})_3(MeSiO_{3/2})_{10} \quad \text{[Formula I]}$$

$$(HMe_2SiO_{1/2})_2(HMeSiO_{2/2})_2(Me_\square SiO_{2/2})_{10} \quad \text{[Formula J]}$$

The respective test samples were measured for physical properties, and the results are listed in Table 2, as follows.

TABLE 2

|  | Test Sample A | Test Sample B | Test Sample C |
|---|---|---|---|
| Moisture Permeability | 15 g/cm²/day | 106 g/cm²/day | 120 g/cm²/day |
| Durability/Reliability | ○ | x | x |
| Yellowing | ○ | ○ | x |

As seen in Table 2, it was confirmed that test sample A containing both the siloxane units of Formulas 2 and 3 showed excellent moisture permeability, durability/reliability and yellowing properties, but test sample B containing one of the siloxane units of Formula 2 and 3 as well as test sample C free of the siloxane units of Formulas 2 and 3 show significantly deteriorated physical properties.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art.

The invention claimed is:

1. A silicone resin that is represented by an average composition formula of Formula 1 and comprises a siloxane unit of Formula 2 and a siloxane unit of Formula 3, wherein a molar ratio of aryl groups bound to the silicon atom with respect to the total silicon atoms is in a range of 0.7 to 1.3, wherein a molar ratio of aryl groups bound to the silicon atom in the siloxane unit of Formula 2 with respect to the total silicon atoms is in a range from 0.4 to 0.8 and wherein a molar ratio of aryl groups bound to the silicon atom in the siloxane unit of the Formula 3 with respect to the total silicon atoms is in a range from 0.25 to 0.7:

$$(R_3SiO_{1/2})_a(R_2SiO_{2/2})_b(RSiO_{3/2})_c(SiO_{4/2})_d \quad \text{[Formula 1]}$$

$$R^1R^2SiO_{2/2} \quad \text{[Formula 2]}$$

$$R^3SiO_{3/2} \quad \text{[Formula 3]}$$

wherein the groups R in the Formula 1 R are substituents directly bound to a silicon atom, and each independently represents hydrogen, an alkoxy group having 1 to 12 carbon atom(s), a hydroxy group, an epoxy-containing group, a (meth)acryloyl-containing group, an isocyanate-containing group, an alkyl having 1 to 12 carbon atom(s), an alkenyl group having 2 to 12 carbon atoms, an aryl group having 6 to 18 carbon atoms or arylalkyl group having 6 to 19 carbon atoms; both of $R^1$ and $R^2$ represent aryl groups having 6 to 18 carbon atoms, $R^3$ represents an aryl group having 6 to 18 carbon atoms, a is in a range of $0 \leq a \leq 0.5$, b is in a range of $0 < b \leq 0.8$, c is in a range of $0 < c \leq 0.8$, and d is in a range of $0 \leq d \leq 0.2$, with the proviso that a+b+c+d is 1.

2. The silicone resin according to claim 1, wherein at least one of R, $R_2$ and $R_3$ in Formula 1 is an epoxy group.

3. The silicone resin according to claim 1, wherein the aryl group is a phenyl group.

4. The silicone resin according to claim 1, wherein all the aryl groups bound to the silicon atom of the silicone resin are comprised in the siloxane unit of Formula 2 or 3.

5. The silicone resin according to claim 1, wherein the siloxane unit of Formula 2 is siloxane unit of Formula 5:

$$(C_6H_5)_2SiO_{2/2}. \quad \text{[Formula 5]}$$

6. The silicone resin according to claim 1, wherein a ratio of a bifunctional siloxane unit of Formula 2 with respect to the total bifunctional siloxane units is 35 mol % or more.

7. The silicone resin according to claim 1, wherein the siloxane unit of Formula 3 is a siloxane unit represented by Formula 6:

$$(C_6H_5)SiO_{3/2}. \quad \text{[Formula 6]}$$

8. The silicone resin according to claim 1, wherein a ratio of a trifunctional siloxane unit of Formula 3 with respect to the total trifunctional siloxane units is 80 mol % or more.

9. The silicone resin according to claim 1, wherein the resin has a viscosity of 500 cP to 100,000 cP at 25° C.

10. The silicone resin according to claim 1, wherein the resin has a weight average molecular weight of 300 to 100,000.

11. A semiconductor device comprising a semiconductor element which is encapsulated by an encapsulant that comprises the silicone resin of claim 1.

12. A light-emitting diode comprising a light emitting element which is encapsulated by an encapsulant that comprises the silicone resin of claim 1.

13. A liquid crystal display device that comprises the light-emitting diode of claim 12 as a backlight unit.

* * * * *